United States Patent [19]

Hawkins

[11] Patent Number: 4,740,868
[45] Date of Patent: Apr. 26, 1988

[54] RAIL BONDED MULTI-CHIP LEADFRAME, METHOD AND PACKAGE

[75] Inventor: George W. Hawkins, Mesa, Ariz.
[73] Assignee: Motorola Inc., Schaumburg, Ill.
[21] Appl. No.: 899,269
[22] Filed: Aug. 22, 1986
[51] Int. Cl.$^4$ ............................................. H05K 5/02
[52] U.S. Cl. ................................... 361/421; 361/415; 174/52 PE; 174/52 FP
[58] Field of Search ............... 174/52 PE, 52 FP; 361/415, 421

[56] References Cited

U.S. PATENT DOCUMENTS

| | | | |
|---|---|---|---|
| 3,898,535 | 8/1975 | Ebbert | 361/421 |
| 3,978,375 | 8/1976 | Fukui et al. | 361/421 |
| 4,264,917 | 4/1981 | Ugon | 174/52 PE |
| 4,331,831 | 5/1982 | Ingram et al. | 174/52 PE |
| 4,337,499 | 6/1982 | Cronin et al. | 361/415 |
| 4,542,260 | 9/1985 | Pearce | 174/52 PE |

FOREIGN PATENT DOCUMENTS 2002571 12/1971 Fed. Rep. of Germany ... 174/52 FP

Primary Examiner—Robert S. Macon
Attorney, Agent, or Firm—Harry A. Wolin

[57] ABSTRACT

A leadframe including a plurality of rails connected directly to input leads and output leads. A plurality of chips can be mounted directly to the plurality of rails forming a rail bonded multi-chip device. Wire bonding can occur directly from the chips to the plurality of rails which function as a heat sink. The resultant multi-chip device is simple, inexpensive, and easy to manufacture.

11 Claims, 2 Drawing Sheets

RAIL BONDED MULTI-CHIP LEADFRAME, METHOD AND PACKAGE

BACKGROUND OF THE INVENTION

This invention generally pertains to a rail bonded multi-chip leadframe, method and package. Commonly used multi-chip devices include separate packages, module systems and hybrid systems. Generally, these multi-chip devices are complex, expensive and spacious. In addition, they do not use standard integrated circuit design or parts and are difficult to manufacture. For example, hybrid systems use a ceramic board inside the package making the system flexible, however, this also makes it much more complex and expensive. These problems and others must be remedied so that memory modules and other multi-chip devices can be manufactured easily and inexpensively.

SUMMARY OF THE INVENTION

The present invention pertains to a rail bonded multi-chip leadframe, method and package. Unlike conventional multi-chip devices, the present invention converts a standard integrated circuit package design into a multi-chip device. To do this, a plurality of conductive, free standing rails are created in the middle of the leadframe rather than a standard flag. The rails are analogous to standard bus bars and each rail is connected and corresponds to a specific input lead or a specific output lead. In addition, these rails serve as a die bond area to which chips are directly bonded. The chips are die bonded to the rails with insulating plastic or the like and then wire bonded and molded conventionally. The rails also serve as the heat sink for the multi-chip device. This allows for simple multi-chip systems to be made with conventional integrated circuit equipment. The present invention is more compact and less expensive than separate packages and also cheaper and less complex than other module or hybrid systems.

It is an object of the present invention to provide a new and improved leadframe including a plurality of rails for use in a multi-chip package.

It is a further object of the present invention to provide a new and improved multi-chip device which uses conventional integrated circuit design.

It is a further object of the present invention to provide a new and improved multi-chip device which is compact and inexpensive to manufacture.

It is a further object of the present invention to provide a new and improved multi-chip device which is less complex than conventional multi-chip devices.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
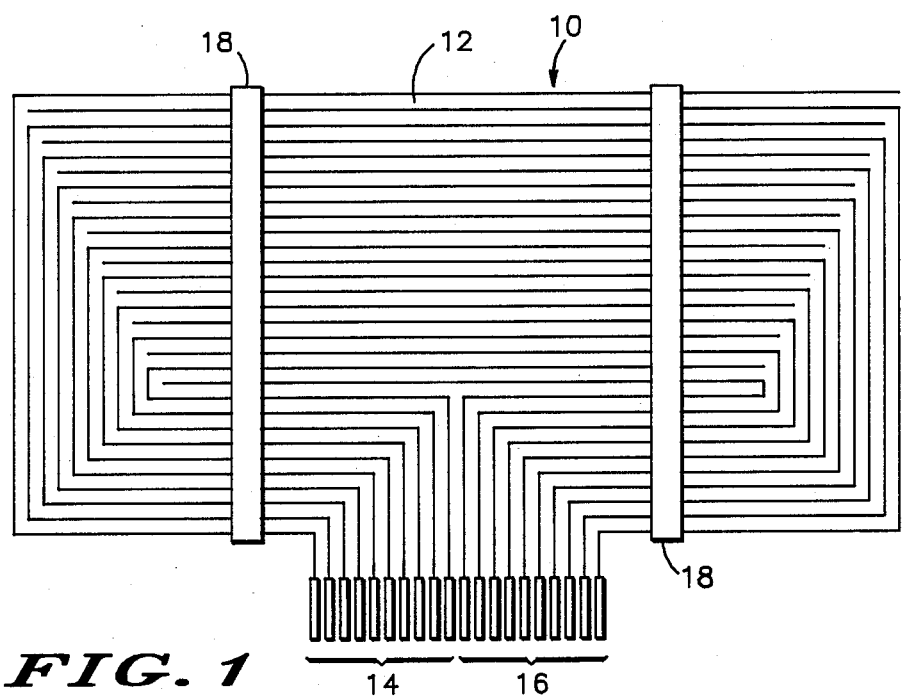
FIG. 1 is a top view of a leadframe embodying the present invention.

Referring specifically to FIG. 1, a top view of a leadframe, designated 10, embodying the present invention is shown. Leadframe 10 includes a plurality of rails, 12. Plurality of rails 12 are analogous to standard bus bar. They are free standing, conductive and also serve as a heat sink for the multi-chip device. In this figure, plurality of rails 12 are parallel to each other but it should be understood that other arrangements may also be used. Leadframe 10 further includes a plurality of input leads, 14, and a plurality of output leads, 16. Specific members of plurality of rails 12 are interleaved from opposite ends and connected to specific input leads 14 or specific output leads 16. Leadframe 10 may be stamped out using conventional methods of leadframe technology. Rail ties, 18, are placed across parallel plurality of rails 12 to hold them in place. In this figure, rail ties 18 are plastic ties, however, rail ties 18 may be one or more of the group comprising cured plastic, plastic ties, epoxy and partially cured epoxy.

Figure 2:
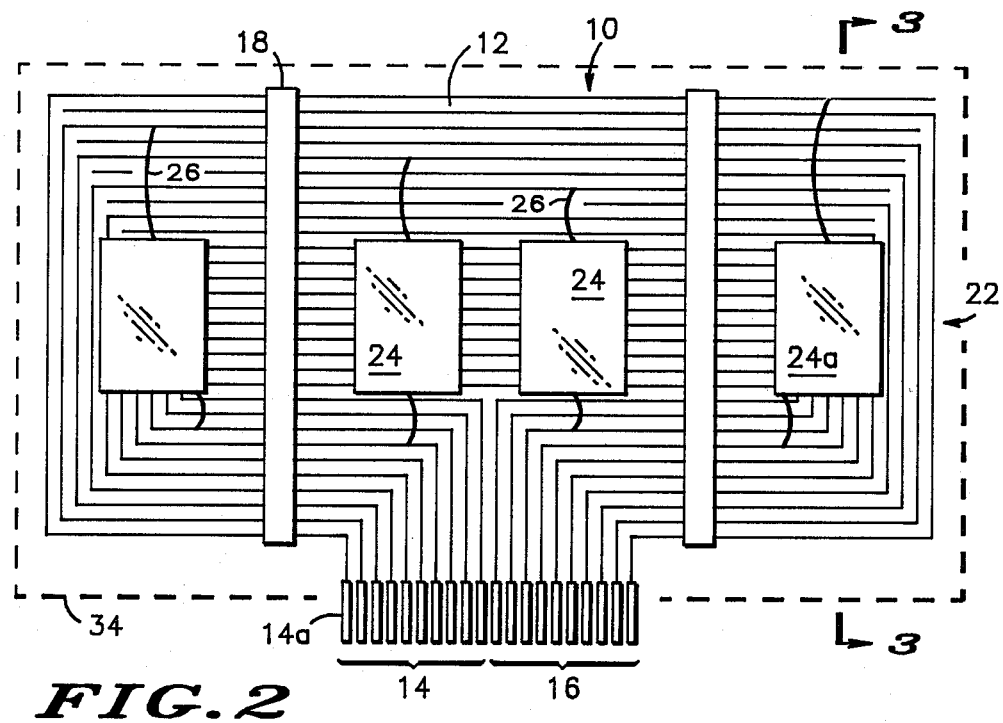
FIG. 2 is a view similar to FIG. 1 of the leadframe assembly further including chips and wire bonds.
Figure 3:
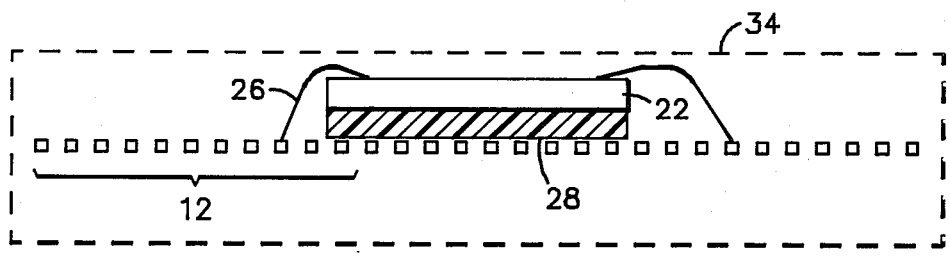
FIG. 3 is a cross-sectional view of the leadframe assembly of FIG. 2 taken from line 3—3.

FIG. 2 is a top view of a leadframe assembly, 22, similar to FIG. 1 further including chips, 24, and wire bonds 26, while FIG. 3 is a cross-sectional view of leadframe assembly 22 taken from line 3—3. Leadframe assembly 22 includes leadframe 10. At designated spots on plurality of rails 12 of leadframe 10, chip mounting material 28 is applied. Chip mounting material 28 is electrically but not thermally insulating. This can be an alumina filled epoxy such as *Able Bond* 84-3 or other materials well known to those skilled in the art. Because plurality of rails 12 serves as a heat sink, heat must be able to dissipate through chip mounting material 28. Chip mounting material 28 may be a partially cured epoxy or the like. This would enable chip mounting material 28 to also serve the purpose of rail ties 18 thereby eliminating the need for them.

Following the application of chip mounting material 28, chips 24 are mounted directly on chip mounting material 28. Once chips 24 are mounted upon chip mounting material 28, wire bonds 26 are bonded from chips 24 directly to specific members of plurality of rails 12. This design allows for relatively easy and trouble free wire bonding. Chips 24 are similar and connected in parallel, each having specific input leads 14 for address. For example, wire bonds 26 connect chip 24a directly to input lead 14a. Therefore, input lead 14a serves as the means of address for chip 24a. Additionally, plurality of rails 12 can be used to electrically interconnect chips 24 for chip to chip communication by wire bonding more than one chip to a single member of plurality of rails 12. This configuration is particularly suited for memory applications and the like. After proceding through the above steps, leadframe assembly 22 is encapsulated in an encapsulation material, 34.

Figure 4:
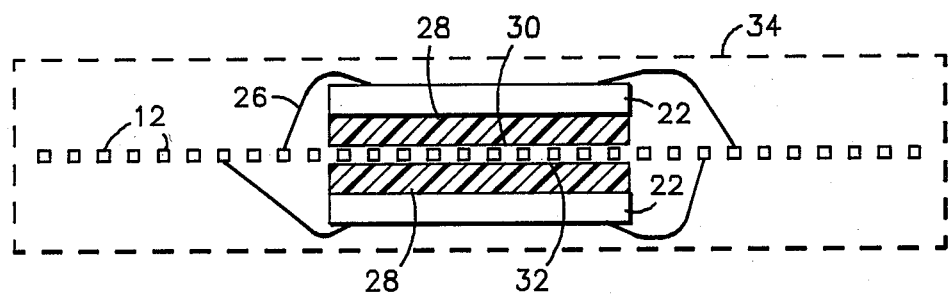
FIG. 4 is a cross-sectional view similar to that of FIG. 3 showing a different chip configuration.

Referring specifically to FIG. 4, a cross-sectional view of a multi-chip device similar to FIG. 3 having a different chip configuration is shown. In this figure, maximum space is used by mounting chips 24 to a first face, 30, and a second face, 32, of plurality of rails 12. First face 30 and second face 32 are opposing faces of plurality of rails 12. Wire bonds 26 also are bonded to first face 30 and second face 32 of plurality of rails 12 depending upon the orientation of the corresponding chips 24. Again, leadframe assembly 22 is completely encapsulated by plastic encapsulation 34 except for input leads 14 and output leads 16.

Thus, it is apparent that there has been provided, in accordance with the invention an improved leadframe, method and package for multi-chip devices which meet objects and advantages set forth above. While we have shown and described specific embodiments of this invention, further modifications and improvements will occur to those skilled in the art. We desire it to be understood, therefore, that this invention is not limited to the particular form shown and we intend in the appended claims to cover all modifications which do not depart from the spirit and scope of this invention.

What is claimed is:

1. An integrated circuit leadframe comprising input leads, output leads, a plurality of free standing, conductive rails connected thereto, each member of said plurality of rails connected to a specific input lead or a specific output lead and being adaptable for electrical isolation from other members of said plurality of rails, and at least one rail tie fixedly holding said rails and disposed to provide integrated circuit mounting areas on said rails on both sides of said rail tie.

2. The leadframe of claim 1 wherein members of the plurality of rails are parallel to each other.

3. A method for producing a rail bonded chip package comprising the steps of:
   stamping out a leadframe comprising input leads, output leads, a plurality of free standing, conductive rails connected thereto, members of said plurality of rails being adaptable for electrical isolation from other members of said plurality of rails, and at least one rail tie fixedly holding said rails and disposed to provide integrated circuit mounting areas on said rails on both sides of said rail tie;
   applying chip mounting material to said plurality of rails;
   mounting at least one chip directly on said chip mounting material to bond said chip directly on said plurality of rails;
   wire bonding said chip to at least one rail of said plurality of rails; and
   encapsulating the leadframe assembly in an encapsulating material.

4. The method of claim 3 further comprising the step of electrically interconnecting chips by wire bonding more than one chip to a single member of the plurality of rails.

5. The method of claim 3 wherein said chip mounting material is electrically but not thermally insulating.

6. The method of claim 3 wherein at least one chip is mounted to both a first face and a second face, said first face and said second face being opposing faces of the plurality of rails.

7. A rail bonded chip package comprising:
   a leadframe including input leads, output leads, a plurality of free standing, conductive rails connected thereto, members of said plurality of rails being adaptable for electrical isolation from other members of said plurality of rails, and at least one rail tie fixedly holding said rails and disposed to provide integrated circuit mounting areas on said rails on both sides of said rail tie;
   at least one chip mounted on chip mounting material directly on said plurality of rails;
   said chip being wire bonded to at least one member of said plurality of rails; and
   an encapsulation surrounding and sealing the leadframe assembly.

8. The rail bonded chip package of claim 7 wherein at least one of a plurality of input leads, a plurality of output leads and a plurality of rails connected thereto operate as an address for each chip attached thereto.

9. The rail bonded chip package of claim 7 whrein chips are electrically interconnected by wire bonding more than one chip to a single member of the plurality of rails.

10. The rail bonded chip package of claim 7 wherein said chip mounting material is electrically but not thermally insulating.

11. The rail bonded chip package of claim 7 wherein at least one chip is mounted to both a first face and a second face said first face and said second face being opposing faces of the plurality of rails.

* * * * *